US012386401B2

(12) United States Patent
Reed et al.

(10) Patent No.: US 12,386,401 B2
(45) Date of Patent: Aug. 12, 2025

(54) CARD CAGE SYSTEM FOR HYBRID COOLING OF COMPUTER CIRCUIT CARDS

(71) Applicant: Raytheon Company, Waltham, MA (US)

(72) Inventors: Christopher Reed, McKinney, TX (US); James Ruiz, McKinney, TX (US)

(73) Assignee: Raytheon Company, Arlington, VA (US)

( * ) Notice: Subject to any disclaimer, the term of this patent is extended or adjusted under 35 U.S.C. 154(b) by 0 days.

(21) Appl. No.: 17/573,464

(22) Filed: Jan. 11, 2022

(65) Prior Publication Data

US 2023/0221780 A1    Jul. 13, 2023

(51) Int. Cl.
*G06F 1/20* (2006.01)
*G06F 1/18* (2006.01)
*H05K 7/14* (2006.01)
*H05K 7/20* (2006.01)

(52) U.S. Cl.
CPC ............... *G06F 1/20* (2013.01); *G06F 1/183* (2013.01); *H05K 7/1424* (2013.01); *H05K 7/20136* (2013.01); *G06F 2200/201* (2013.01)

(58) Field of Classification Search
CPC ...... G06F 1/20; G06F 1/183; G06F 2200/201; G06F 1/181; H05K 7/1424; H05K 7/20136; H05K 7/20581; H05K 7/20563; H05K 7/1404; H05K 7/20545; H05K 7/20145; H05K 7/1425; H05K 7/1418; H05K 7/1422; H05K 7/20
See application file for complete search history.

(56) References Cited

U.S. PATENT DOCUMENTS

| 4,277,815 A | * | 7/1981 | Skroupa | H05K 7/20563 361/802 |
| 4,829,402 A | * | 5/1989 | Gewebler | H05K 7/1404 361/802 |
| 5,424,916 A | * | 6/1995 | Martin | H05K 7/20636 361/698 |

(Continued)

FOREIGN PATENT DOCUMENTS

| JP | H07-131173 A | 5/1995 |
| JP | 2007-165764 A | 6/2007 |
| JP | 2009-071006 A | 4/2009 |

OTHER PUBLICATIONS

International Search Report for International Application No. PCT/US2022/049701 dated Mar. 14, 2023, 14 pages.

(Continued)

*Primary Examiner* — Abhishek M Rathod

(57) ABSTRACT

Disclosed herein is a computer circuit card cage system configured to house one or more computer circuit cards. The computer circuit card cage system can comprise a housing comprising one or more walls having one or more apertures formed therein. The computer circuit card cage system can further comprise one or more support rails supported on one or more of the walls and configured to support a computer circuit card. The one or more support rails can have one or more apertures formed therein to facilitate flow of a fluid through the one or more support rails. The flow path of the fluid is through the one or more apertures in the walls of the housing, and the one or more apertures in the support rails.

20 Claims, 9 Drawing Sheets

(56) References Cited

U.S. PATENT DOCUMENTS

| | | | | |
|---|---|---|---|---|
| 5,493,473 | A | * | 2/1996 | Yanagi ............... H05K 7/20563 361/796 |
| 5,506,751 | A | * | 4/1996 | Chatel ................ H05K 7/1418 361/802 |
| 5,978,217 | A | * | 11/1999 | Kerrigan ................ G06F 1/20 165/80.4 |
| 6,285,548 | B1 | * | 9/2001 | Hamlet ............... H05K 7/1461 361/689 |
| 6,683,787 | B1 | * | 1/2004 | Banton ............. H05K 7/20727 165/185 |
| 6,879,486 | B1 | * | 4/2005 | Banton ............. H05K 7/20563 165/185 |
| 7,075,796 | B1 | * | 7/2006 | Pritchett ............. H05K 7/1408 361/756 |
| 7,256,992 | B1 | * | 8/2007 | Stewart .................. G06F 1/20 361/679.48 |
| 7,324,336 | B2 | * | 1/2008 | Vos ..................... H05K 7/1404 165/104.33 |
| 7,450,384 | B2 | * | 11/2008 | Tavassoli .......... H05K 7/20636 361/689 |
| 8,416,570 | B2 | | 4/2013 | Zeng et al. |
| 8,477,498 | B2 | | 7/2013 | Porreca et al. |
| 9,084,370 | B2 | * | 7/2015 | Bellin ............... H05K 7/20145 |
| 9,392,725 | B2 | * | 7/2016 | Stringer ............ H05K 7/20009 |
| 9,999,156 | B2 | * | 6/2018 | Holahan ............ H05K 7/20645 |
| 11,026,347 | B2 | * | 6/2021 | Wong ............. H05K 7/20409 |
| 2006/0002084 | A1 | * | 1/2006 | Wei .................... H05K 7/20745 361/695 |
| 2006/0087814 | A1 | | 4/2006 | Brandon et al. |
| 2007/0070601 | A1 | * | 3/2007 | Vos ..................... H05K 7/1404 361/694 |
| 2008/0007913 | A1 | * | 1/2008 | Sullivan ............ H05K 7/20636 361/699 |
| 2010/0008025 | A1 | * | 1/2010 | Nemoz ............. H05K 7/20563 361/678 |
| 2011/0267776 | A1 | | 11/2011 | Porreca et al. |
| 2014/0251577 | A1 | | 9/2014 | Connors |
| 2015/0181763 | A1 | | 6/2015 | de Bock et al. |
| 2015/0201527 | A1 | * | 7/2015 | Stringer ............ H05K 7/20254 165/80.3 |
| 2017/0318703 | A1 | * | 11/2017 | Klein ..................... F16K 27/00 |
| 2018/0124950 | A1 | * | 5/2018 | Holahan ........... H05K 7/20272 |
| 2018/0124953 | A1 | | 5/2018 | Engelhardt et al. |

OTHER PUBLICATIONS

Notice of Reasons for Refusal dated Feb. 4, 2025 in connection with Japanese Patent Application No. 2024-522614, 11 pages.

* cited by examiner

CARD CAGE SYSTEM FOR HYBRID COOLING OF COMPUTER CIRCUIT CARDS

GOVERNMENT LICENSE RIGHTS

This invention was made with government support under Contract No. HQ0727-20-F-1621 awarded by the Department of Defense. The government has certain rights in the invention.

BACKGROUND

Computer circuit cards and expansion cards are ubiquitous in modern society and are used in the operation of computer systems in a wide variety of computing applications. Computer circuit cards having high power density tend to operate at high temperatures and are difficult to cool. Bulky and large liquid cooling systems are often implemented into card cages that hold the cards in order to provide adequate cooling to the computer circuit cards. However, computer circuit cards and card cages are often used in systems that only allow a small amount of space to be used for the installation of the computer circuit cards and card cages. As such, large liquid cooling systems cannot be used to cool the computer circuit cards as there is not enough room in a space-constrained system to accommodate the liquid cooling systems. Often only one mode of heat transfer/cooling (e.g., conduction support rails or forced air cooling) can be utilized within a card cage to cool computer circuit cards in space-constrained computing systems. Additional heat transfer and/or cooling operations or systems are often needed to adequately cool computer cards. Therefore, in order to ensure proper operating temperature and predictable desired operation of computer circuit cards, improvements and innovations to cooling systems for cooling computer cards in limited-space systems continue to be developed.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Figure 1:
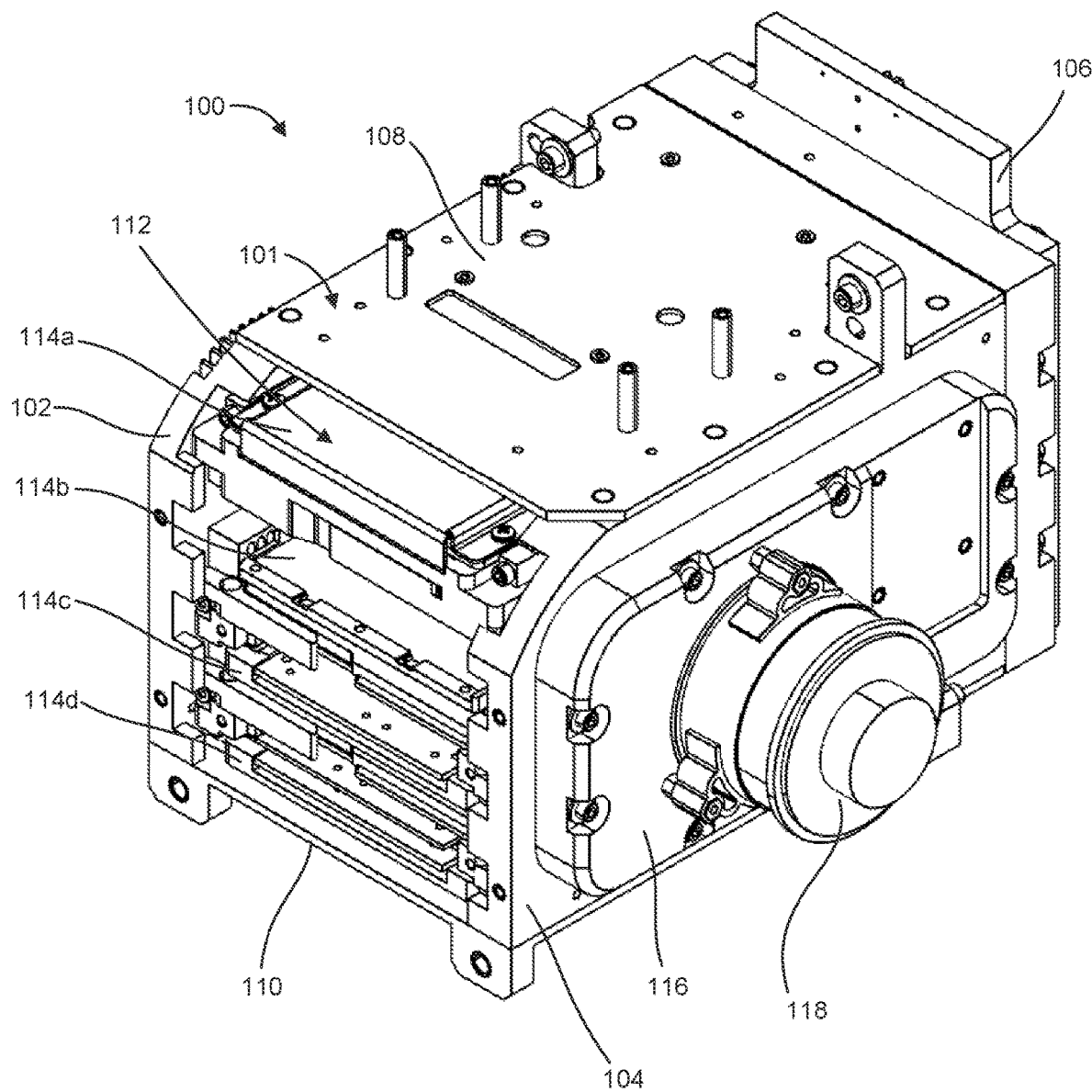
FIG. 1 illustrates an isometric view of a card cage system in accordance with an example of the present disclosure.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of the inventive concepts are provided below and then specific examples are described in further detail later. This initial summary is intended to aid readers in understanding the examples more quickly, but is not intended to identify key features or essential features of the examples, nor is it intended to limit the scope of the claimed subject matter.

Disclosed herein is a computer circuit card cage system configured to house one or more computer circuit cards. The computer circuit card cage system can comprise a housing including one or more walls having one or more apertures formed therein. The card cage system can further comprise one or more support rails supported on one or more of the one or more walls. The support rails can each be configured to support a computer circuit card. The one or more support rails can have one or more apertures formed therein to facilitate flow of a fluid through the one or more support rails. A flow path of the fluid can be through the one or more apertures in the walls of the housing, and the one or more apertures in the support rails.

Further disclosed herein is a method for configuring computer circuit card cage system configured to house one or more computer circuit cards. The method can comprise configuring the card cage system to comprise a housing comprising one or more walls having one or more apertures formed therein. The method can further comprise configuring the card cage system to comprise one or more support rails supported on one or more of the walls and configured to support a computer circuit card. The method can further comprise configuring the one or more support rails to have one or more apertures formed therein to facilitate flow of a fluid through the one or more support rails. A flow path of the fluid can be through the one or more apertures in the walls of the housing, and the one or more apertures in the support rails.

To further describe the present technology, examples are now provided with reference to the figures. With reference to FIG. 1, illustrated is a card cage system 100 in accordance with an example of the present disclosure. Card cage system 100 can be configured to house one or more computer circuit cards therein. As shown, the card cage can comprise a housing 101 comprising a plurality of walls. For example, the housing 101 of the card cage system 100 can include a first side wall 102, and a second side wall 104 disposed parallel and opposite to the first side wall 102. A rear wall 106 can abut the first side wall 102 and the second side wall 104 at a rear of the card cage system 100, Furthermore, a top wall 108 can abut the first side wall 102, the second side wall 104, and the rear wall 106 at a top of the card cage system 100. A bottom wall 110 can abut the first side wall 102, the second side wall 104, and the rear wall 106 at a bottom of the card cage system 100.

The first side wall 102, the second side wall 104, the rear wall 106, the top wall 108, and the bottom wall 110 of the card cage system 100 can together form and define a circuit card storage cavity 112 configured to receive and hold one or more computer circuit cards (e.g., see, for example, computer circuit cards 114a, 114b, 114c, and 114d). The card cage system 100 can include a plurality of support rails that each contact and support one or more of the computer circuit cards 114a, 114b, 114c, and 114d.

Additionally, as shown in FIG. 1, the card cage system 100 can further include an aperture cover 116 that covers one of the side walls (e.g., second side wall 104, as shown) of the card cage system 100. A fan 118 can be attached to and supported by the aperture cover 116. As will be described in more detail below, the fan 118 can operate to drive a cooling fluid (e.g., ambient air or other gas) through the card cage system 100. Although the term "air" is used within this disclosure, the disclosure is not intended to be limited in any way to this specific type of fluid. Indeed, the cooling fluid can comprise any known fluid for cooling or heating that can be used within the card cage system 100.

Figure 2A:
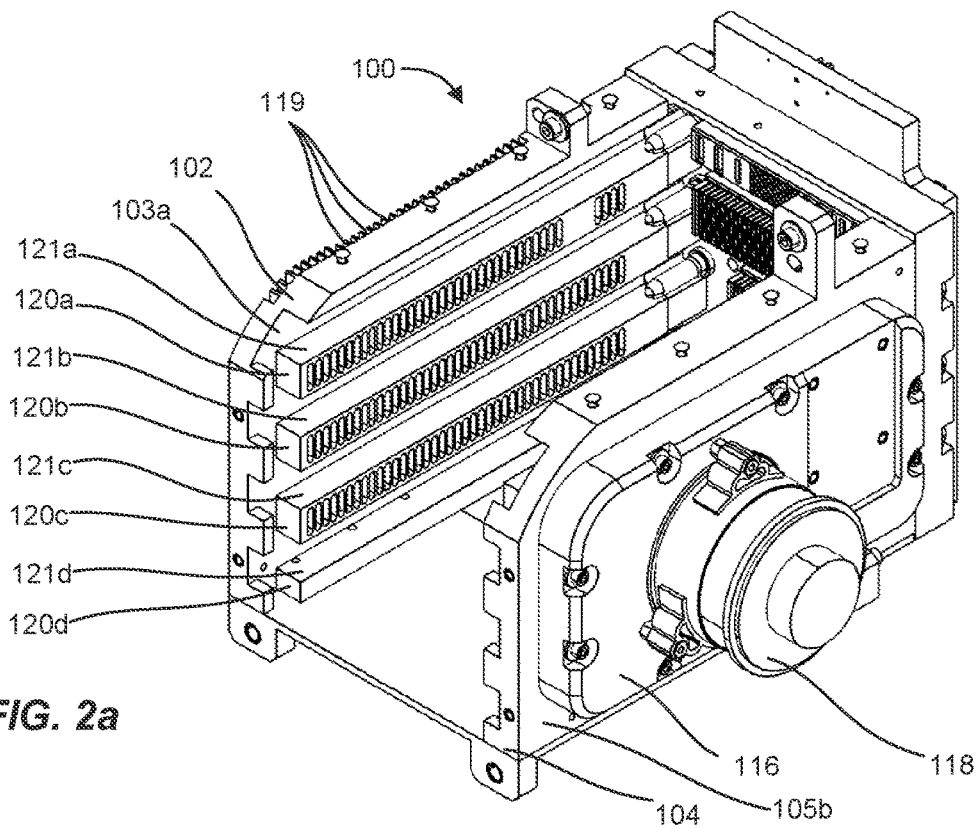
FIGS. 2*a* and 2*b*, respectively, illustrate isometric views of internal configurations of the card cage system of FIG. 1, viewed from a first side and a second side.
Figure 2B:
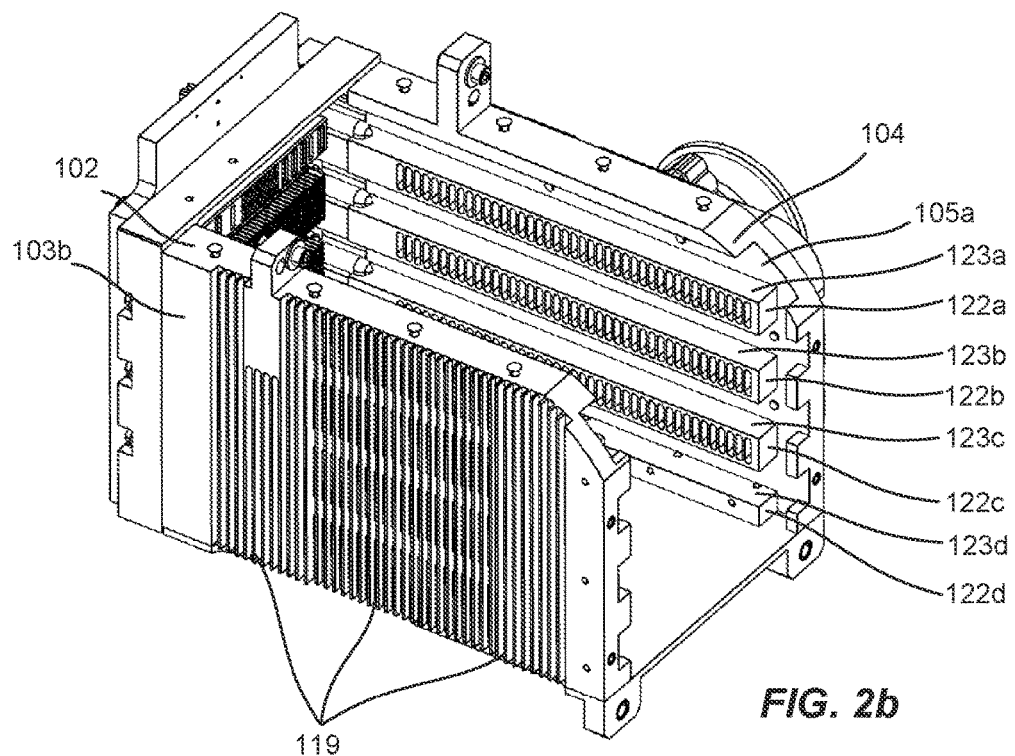

Further details of the card cage system 100 are shown and described with reference to FIGS. 2a and 2b. FIGS. 2a and 2b illustrate card cage system 100 with top wall 108 and circuit cards 114a, 114b, 114c, and 114d removed to more clearly show the internal configuration of the card cage system 100.

FIG. 2a illustrates an isometric view of the card cage system 100 as seen with the second side wall 104 closest to the viewer. As shown in FIG. 2a, the first side wall 102 can comprise a plurality of support rails 120a, 120b, 120c, and 120d that are supported on an inner side 103a of the first side wall 102. Each of the support rails 120a, 120b, 120c, and 120d can comprise a support surface 121a, 121b, 121c, and 121d for one of the computer circuit cards 114a, 114b, 114c, and 114d. The computer circuit cards 114a, 114b, 114c, and 114d can be configured to contact and interface with the respective support surfaces 121a, 121b, 121c, and 121d of support rails 120a, 120b, 120c, and 120d.

Each of the support rails 120a, 120b, 120c, and 120d can be wholly or partially made of, or coated in, a thermally conductive material. The thermally conductive material can facilitate thermal conduction of heat generated by computer circuit cards 114a, 114b, 114c, and 114d away from the computer circuit cards through the thermally conductive support rails and allow for the heat to be dissipated to the ambient environment in order to cool computer circuit cards 114a, 114b, 114c, and 114d.

FIG. 2b illustrates an isometric view of the card cage system 100 as seen with the first side wall 102 closest to the viewer. As shown in FIGS. 1 and 2a, the second side wall 104 can comprise a plurality of support rails 122a, 122b, 122c, and 122d that are supported on an inner side 105a of the second side wall 104. Each of the support rails 122a, 122b, 122c, and 122d can comprise a support surface 123a, 123b, 123c, and 123d for one of the computer circuit cards 114a, 114b, 114c, and 114d. The computer circuit cards 114a, 114b, 114c, and 114d can be configured to contact and interface with the respective support surfaces 123a, 123b, 123c, and 123d of support rails 122a, 122b, 122c, and 122d.

Each of the support rails 122a, 122b, 122c, and 122d can be wholly or partially made of, or coated in, a thermally conductive material. Example materials include, but are not limited to, aluminum, copper, graphite, thermally conductive ceramics, and others that will be apparent to those skilled in the art. Example coatings can include, but are not limited to, thermal grease, paste, gel, graphite, graphite pads, phase change materials, and others that will be apparent to those skilled in the art. The thermally conductive material can facilitate thermal conduction of heat generated by computer circuit cards 114a, 114b, 114c, and 114d away from the computer circuit cards and allow for the heat to be dissipated to the ambient environment in order to cool computer circuit cards 114a, 114b, 114c, and 114d.

Figure 3:
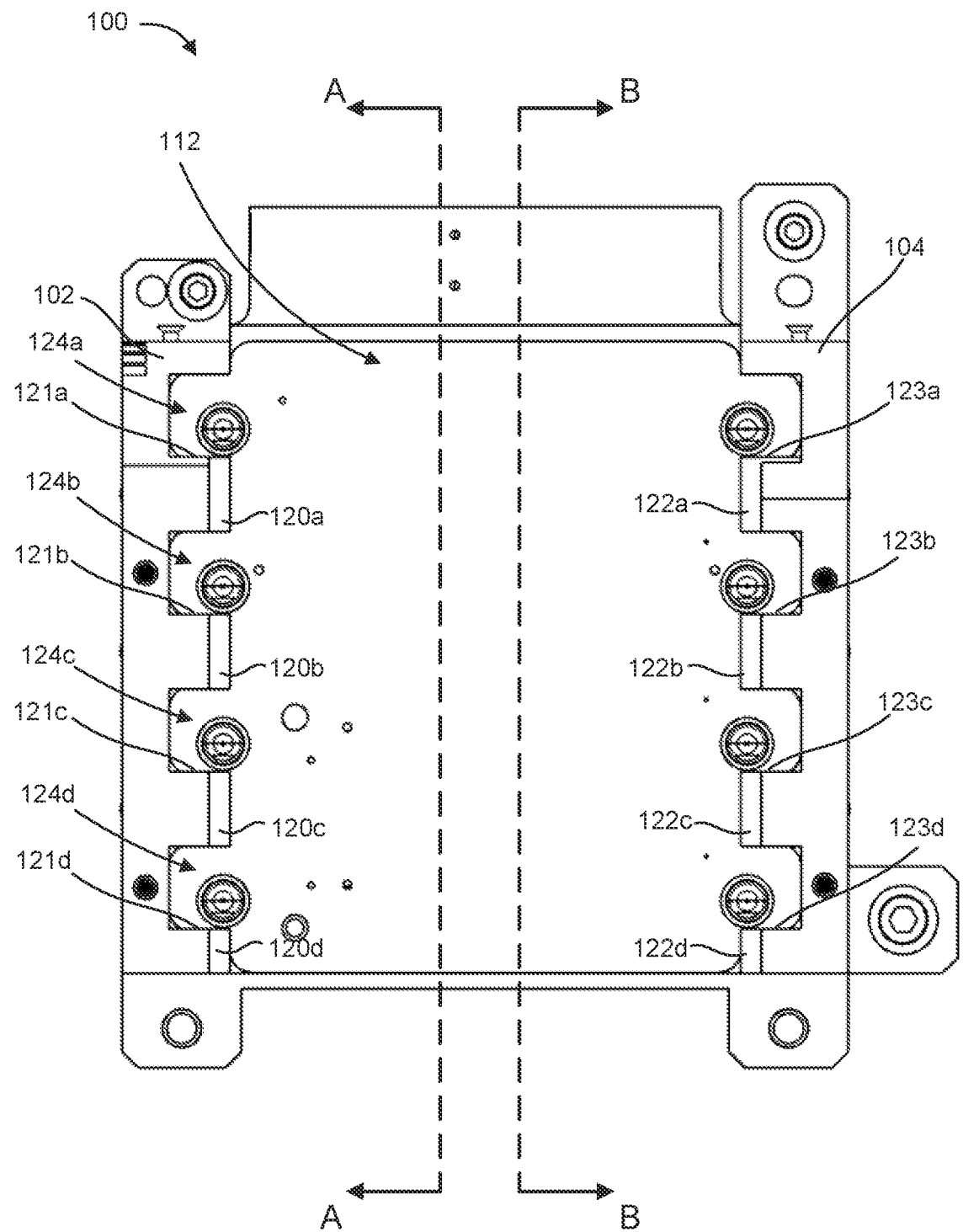
FIG. 3 illustrates a front view of the card cage system of FIG. 1.

FIG. 3 illustrates a front view of the card cage system 100 with computer circuit cards 114a, 114b, 114c, and 114d removed. The second side wall 104 and the first side wall 102 are positioned opposite to each other. The first side wall 102 and the second side wall 104 define, at least in part, the circuit card storage cavity 112 between the first side wall 102 and the second side wall 104. The circuit card storage cavity 112 is configured to store one or more computer circuit cards on the support surfaces of the support rails.

As shown, the first side wall 102 comprises the first support rails 120a, 120b, 120c, and 120d each disposed in locations that are spaced apart from each other. The second side wall 104 comprises the second support rails 122a, 122b, 122c, and 122d each disposed in locations that are spaced apart from each other substantially the same as the first support rails. In other words, support rail 120a is substantially located on a same plane as support rail 122a such that the support surface 121a and the support surface 123a are on a same plane to support a computer circuit card.

The support surfaces 121a and 123a of the support rail 120a on first side wall 102 and its correspondingly positioned support rail 122a on second side wall 104 at least partially define a first circuit card slot 124a within the circuit card storage cavity 112 of card cage system 100. Similarly, the support surfaces 121b and 123b of the support rail 120b and correspondingly positioned support rail 122b at least partially define a second circuit card slot 124b, The support surfaces 121c and 123c of the support rail 120c and correspondingly positioned support rail 122c at least partially define a third circuit card slot 124c. The support surfaces 121d and 123d of the support rail 120d and correspondingly positioned support rail 122d at least partially define a fourth circuit card slot 124d. Each of the card slots 124a, 124b, 124c, and 124d are configured to receive a computer circuit card therein and to support the computer circuit card on the support surfaces of each card slot (e.g., see FIG. 1).

Figure 4A:
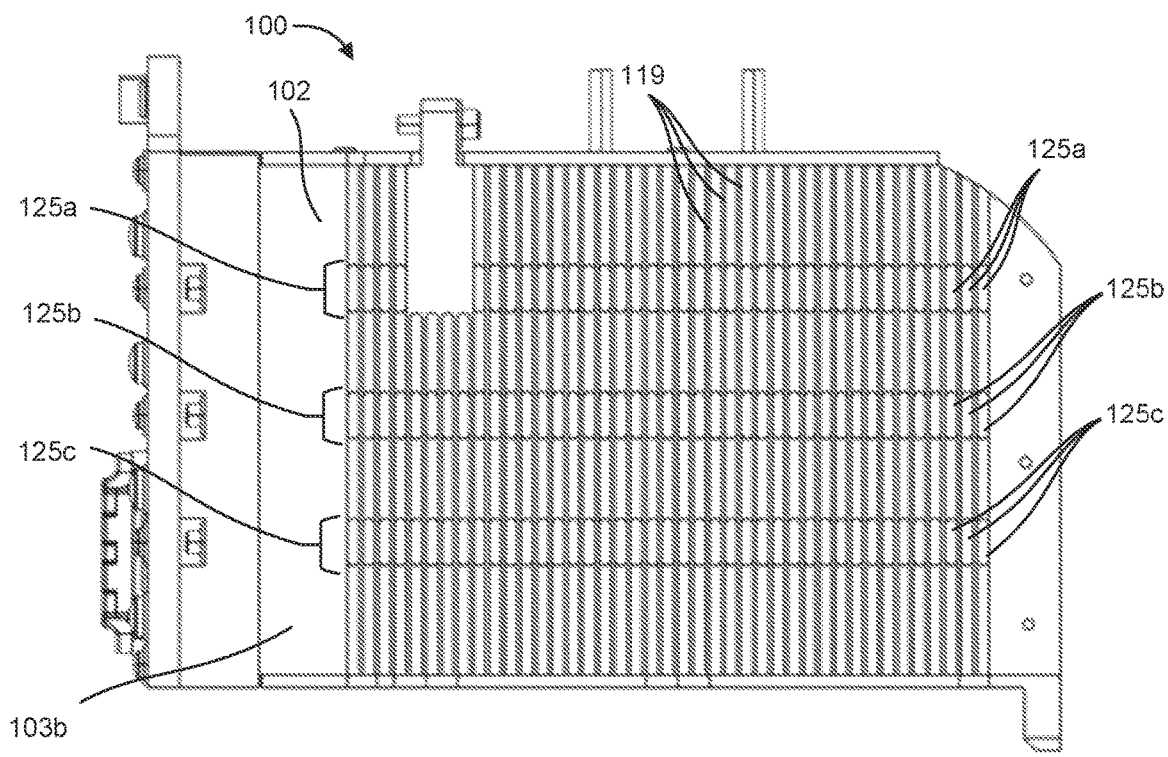
FIG. 4*a* illustrates a side view of a first side of the card cage system of FIG. 1.

FIG. 4a illustrates a side view of the first side wall 102 of the card cage system 100 showing the outer side 103b of first side wall 102. A plurality of apertures 125 (e.g., including apertures 125a, 125b, and 125c) can be formed in the first side wall 102. As illustrated according to one example, three rows of apertures 125 can be formed in the first side wall 102 including first apertures 125a, second apertures 125b, and third apertures 125c.

Additionally, fins 119 can be formed or supported on first side wall 102 and each fin 122 can be disposed between apertures 125 formed through first side wall 102. Fins 119 can help to aid in heat transfer. The fins 119 are extensions on exterior surface of first side wall 102 of card cage system 100. Fins such as the fins 119 increase the rate of heat transfer to or from the card cage system 100 by increasing convection between the ambient environment and first side wall 102. Convection is increased by increasing the surface area of the first side wall 102, which in turn increases the heat transfer rate and aids in cooling computer circuit cards 114 housed within card cage system 100.

Figure 4B:
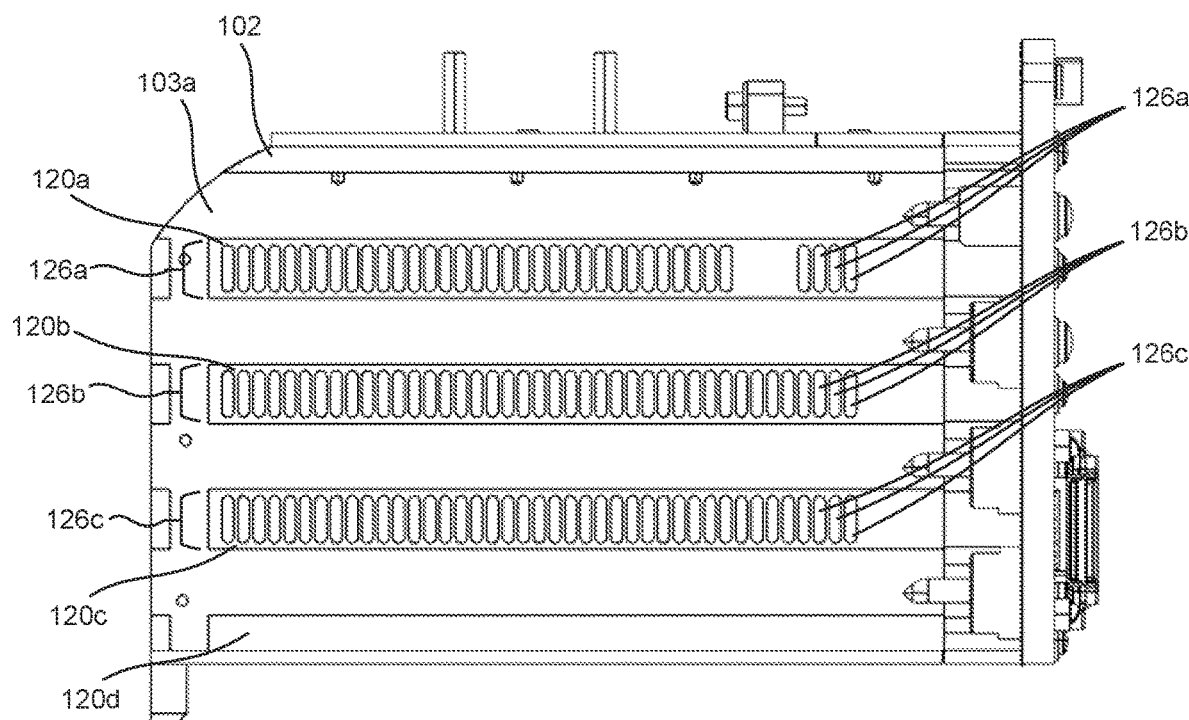
FIG. 4*b* illustrates cross-sectional view of the card cage system of FIG. 1, taken along line AA of the card cage system shown in FIG. 3.

FIG. 4b illustrates a cross-sectional view of card cage system 100 taken along line AA shown in FIG. 3. The support rails 120a, 120b, 120c, and 120d are illustrated supported on the inner side 103a of first side wall 102. The support rails 120a, 120b, 120c, and 120d being "supported" on the first side wall 102 can include the support rails 120a, 120b, 120c, and 120d being integrally formed with the first side wall 102 and can also include the support rails 120a, 120b, 120c, and 120d being formed separately from the first side wall 102 and attached thereto.

As shown in FIG. 4b, apertures 126a, 126b, and 126c can be formed through each of the support rails 120a, 120b, and 120c. The apertures 125a, 125b, 125c in the first side wall 102 can extend from the outer side 103b through the entire thickness and out through the inner side 103a of the first side wall 102. The apertures 126a, 126b, and 126c can extend through the entire thickness of the support rails 120a, 120b, and 120c. The apertures 125a, 125b, and 125c of the first side wall 102 can substantially align with the apertures 126a, 126b, and 126c of the support rails 120a, 120b, and 120c to provide a fluid flow path for a cooling fluid (e.g., ambient air or other gaseous fluid) through the first side wall 102 and the support rails 120a, 120b, and 120c.

Figure 5A:
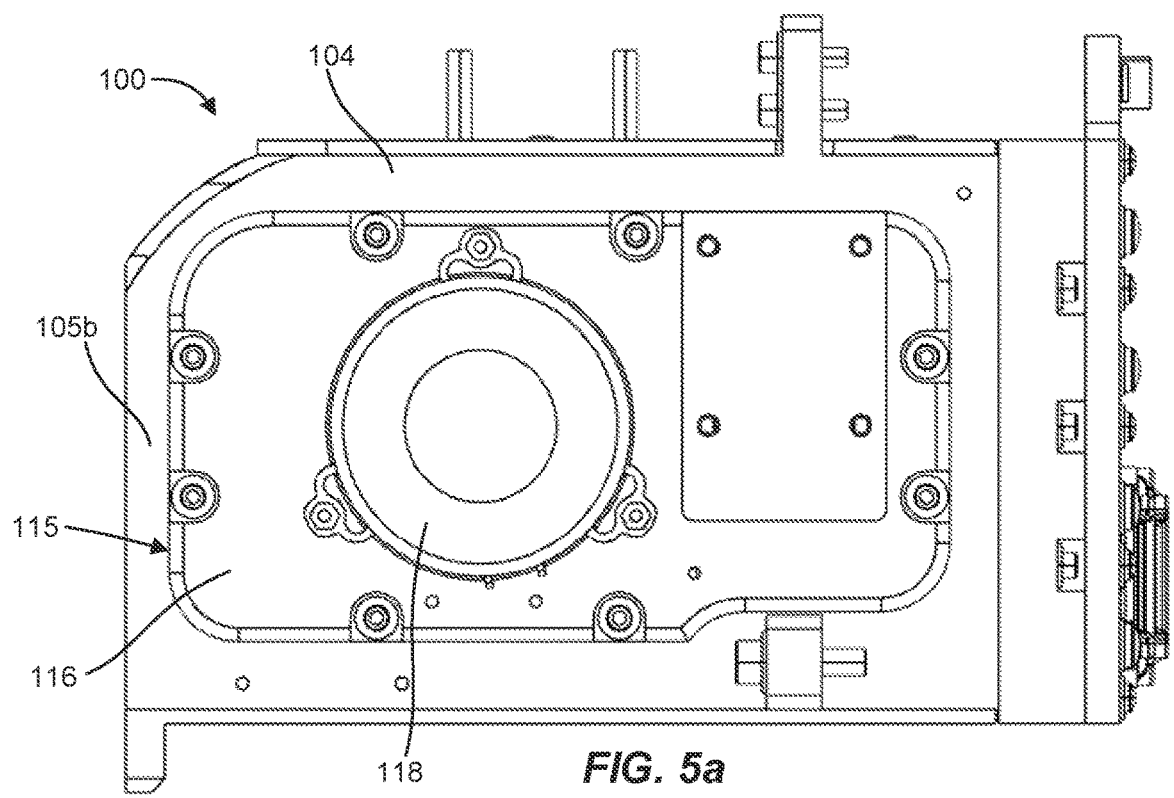
FIG. 5*a* illustrates a side view of a second side of the card cage system of FIG. 1.
Figure 5B:
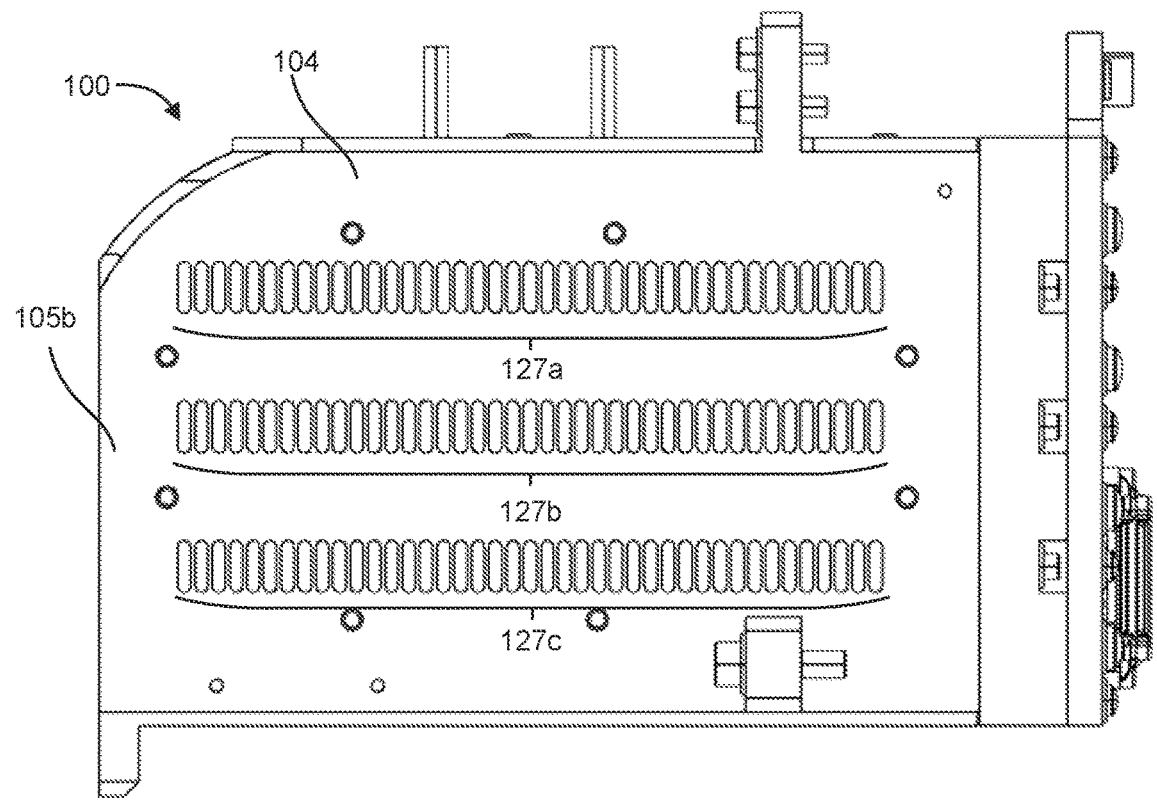
FIG. 5*b* illustrates a side view of the second side of the card cage system of FIG. 5*a* with a fan and cover removed.
Figure 6:
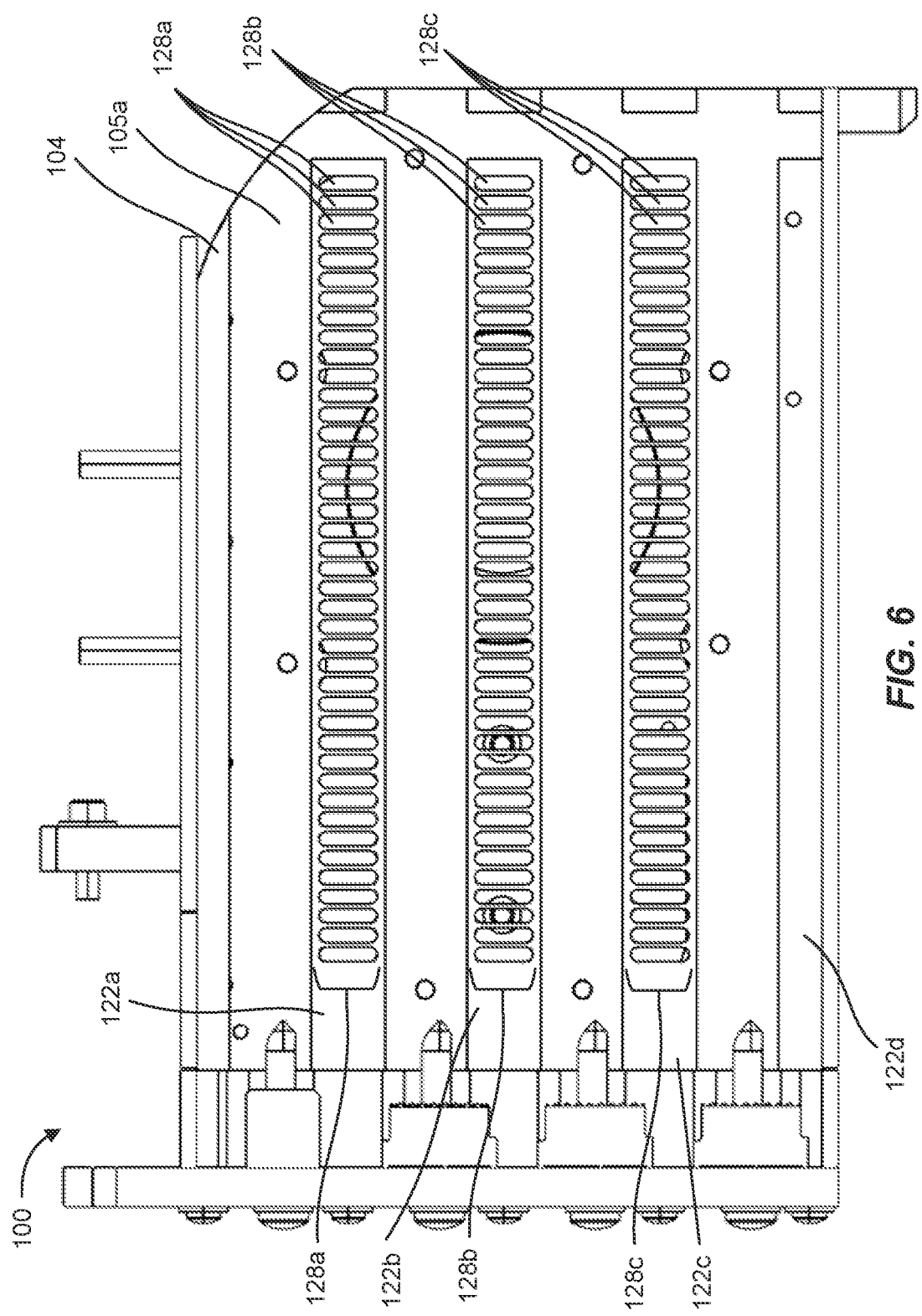
FIG. 6 illustrates cross-sectional view of the card cage system of FIG. 1, taken along line BB of the card cage system shown in FIG. 3.

FIGS. 5a, 5b, and 6 illustrate various views of the second side wall 104. FIG. 5a illustrates a side view of the card cage system 100 showing the second side wall 104 as viewed from outside the card cage system 100. FIG. 5a illustrates the outer side 105b of second side wall 104. The second side wall 104 can support a forced air system 115 configured to force a cooling fluid (e.g., air) through one or more of the apertures 125 and 126 of the first side wall 102 and the second side wall 104. The forced air system 115 can comprise an aperture cover 116 supported on the second side wall 104 at a position to surround and cover a plurality of apertures 128 (see FIG. 5b) formed in the second side wall 104. The forced air system 115 can further comprise a fan 118 supported on the cover 116 configured to operate to force fluid through each of the apertures 128 through either blowing or suction of fluid through the apertures 128. The cover 116 and apertures 128 can together function as a fan manifold defining one or more air channels through which fluid driven by the fan flows. The air channels of the manifold can comprise the air channels of the apertures 128 and an air chamber 130 defined by the cover 116 in which fluid is made to flow by operation of the fan 118. Additionally, a fan manifold may be modified to include individual channels formed in the cover 116, or tubes and passages from the apertures 128 to the fan 118.

FIG. 5b illustrates a side view of the second side wall 104 of the card cage system 100 showing the outer side 105b of second side wall 104 with the cover 116 and the fan 118 removed. A plurality of apertures 127 (including apertures 127a, 127b, and 127c) can be formed in the second side wall 104. As illustrated according to one example, three rows of apertures 127 can be formed in the second side wall 104 including first apertures 127a, second apertures 127b, and third apertures 127c.

FIG. 6 illustrates a cross-sectional view of card cage system 100 taken along line BB shown in FIG. 3. The support rails 122a, 122b, 122c, and 122d are illustrated supported on the inner side 105a of second side wall 104. The support rails 122a, 122b, 122c, and 122d being "supported" on the second side wall 104 can include the support rails 122a, 122b, 122c, and 122d being integrally formed with the second side wall 104 and can also include the support rails 122a, 122b, 122c, and 122d being formed separately from the second side wall 104 and attached thereto.

As shown in FIG. 6, apertures 128a, 128b, and 128c can be formed through each of the support rails 122a, 122b, and 122c. The apertures 127a, 127b, 127c of the second side wall 104 can extend from the outer side 105b through the entire thickness and out through the inner side 105a of the second side wall 104. The apertures 128a, 128b, and 128c of the support rails can extend through the entire thickness of the support rails 122a, 122b, and 122c. The apertures 127a, 127b, and 127c of the second side wall 104 can substantially align with the apertures 128a, 128b, and 128c of the support rails 120a, 120b, and 120c to provide a fluid flow path for a cooling fluid (e.g., ambient air or other gaseous fluid) through the first side wall 102 and the support rails 120a, 120b, and 120c.

As shown in FIGS. 4b and 6, apertures are not necessarily formed in all support rails. Apertures can be formed in one or more of the support rails, up to all support rails in the card cage system 100. Furthermore, it will be appreciated that the support rails described herein may be either integrally formed with the side walls or may be made separately from and then attached to the side walls. In a configuration where the support rails are integrally formed with the side wall, each aperture may be a single aperture formed through both the side wall and the support rail. In an alternative configuration, where the support rails are formed separately from the side wall and then attached to the side wall, separate apertures can be formed in the side wall and in the support rails. The support rails can be attached to the side wall such that the apertures in the side wall substantially align with the apertures of the support rails to form a fluid flow path through the side wall and the support rail.

For clarity, not all apertures are individually identified in FIGS. 4a, 4b, 5b, and 6, however, as shown, the apertures 125 and 126 are arranged over a majority of the lengths of support rails 120a, 120b, 120c 122a, 122b, and 122c. The apertures 125 and 126 can be formed through an entire thickness of first side wall 102 and the second side wall 104, respectively, such that the apertures are accessible from both sides of the first side wall 102 and the second side wall 104. Accordingly, a fluid, such as any gas or ambient air, can pass through the first side wall 102 along a fluid flow path through apertures 125 of the first side wall 102. A fluid, such as any gas or ambient air, can further pass through the second side wall 104 along a fluid flow path through apertures 126 of the second side wall 104. Furthermore, FIGS. 4a-6 show that apertures 125 and 126 have an oblong oval shape as formed in the support rails and side walls.

However, the shape of the apertures is not intended to be limited in any way by this disclosure. Any shape of aperture can be used.

Figure 7:
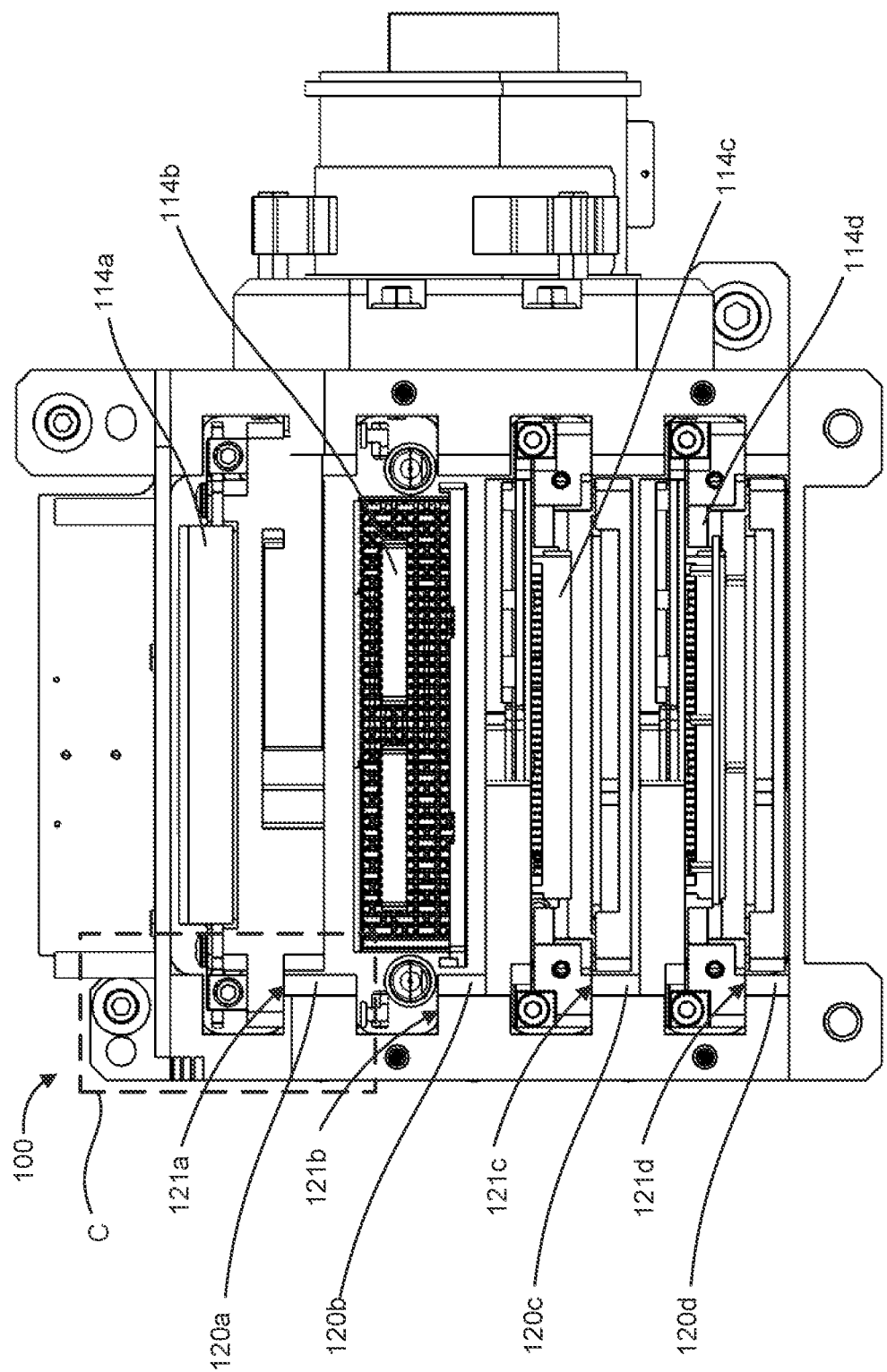
FIG. 7 illustrates a front view of the card cage system of FIG. 1.

FIG. 7 illustrates a front view of the card cage system 100 with computer circuit cards 114a, 114b, 114c, and 114d being supported in the card cage system 100. The computer circuit card 114a is supported on at least the support surface 121a of the support rail 120a, the computer circuit card 114b is supported on at least the support surface 121b of the support rail 120b, the computer circuit card 114c is supported on at least the support surface 121c of the support rail 120c, and the computer circuit card 114d is supported on at least the support surface 121d of the support rail 120d.

Each of the computer circuit cards 114a, 114b, 114c, and 114d can be in physical contact with their respective support surfaces 121a, 121b, 121c, and 121d. With each computer circuit card in contact with a thermally conductive support rail, the heat generated by each computer circuit card during operation can be conducted away from the computer circuit cards to facilitate cooling of the computer circuit cards.

Figure 8:
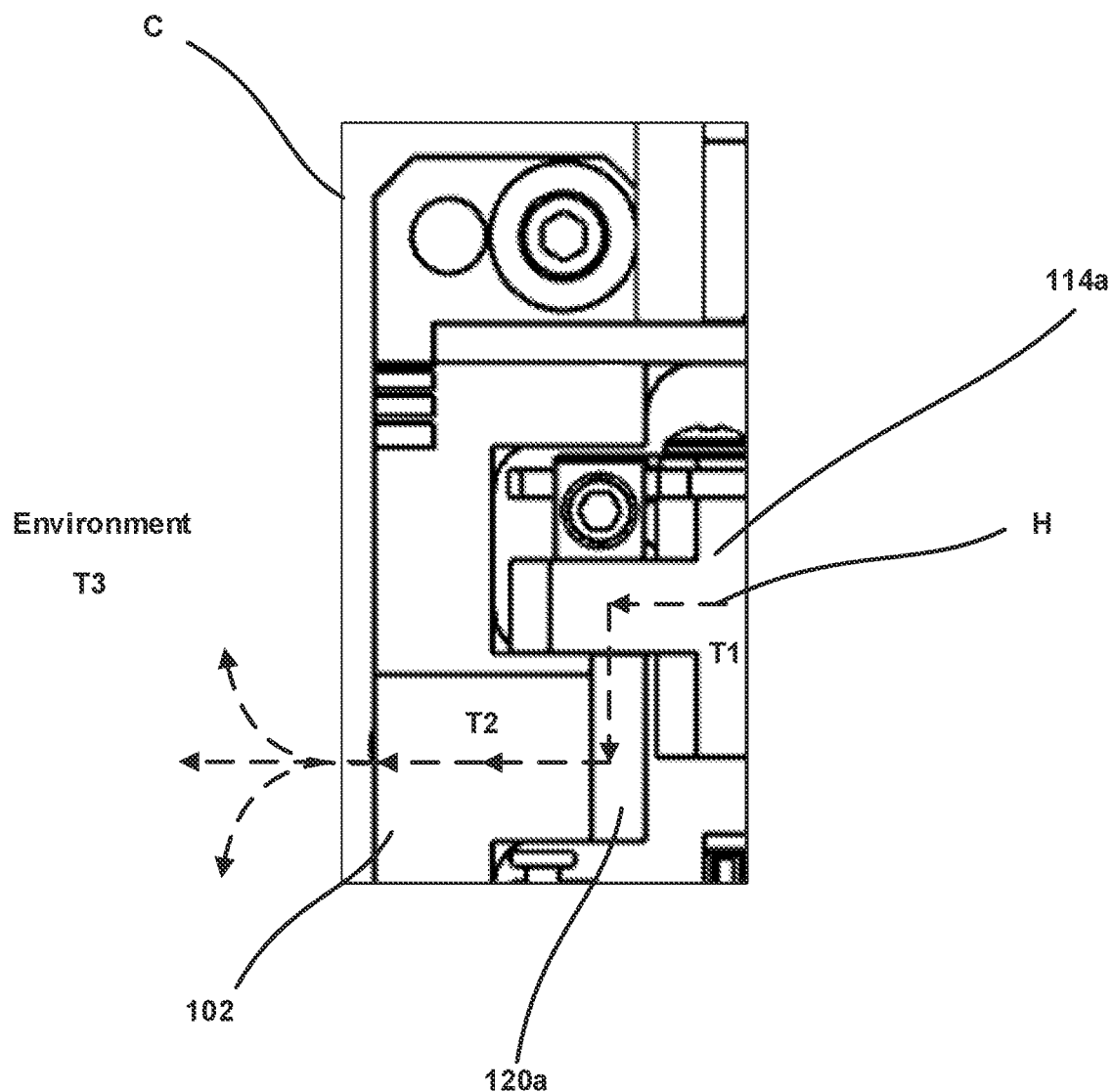
FIG. 8 illustrates a close up view of section C from FIG. 7.

FIG. 8 illustrates a close up view of section C from FIG. 7. FIG. 8 shows the flow of heat H by conduction through the computer circuit card 114a to thermally conductive support rail 120a, to first side wall 102, and finally out to the ambient environment. Other computer circuit cards 114b, 114c, and 114d are cooled in a manner similar to that shown in FIG. 8.

In conduction, heat H is transferred from a first temperature location to a second temperature location. For conduction to operate there must be a temperature difference between the two locations. The transfer of heat H will continue as long as there is a difference in temperature (i.e., a temperature differential) between the two locations, but once the two locations have reached the same temperature, thermal equilibrium is established and the heat transfer stops. As is known by one of skill in the art, conduction causes heat H to flow from a higher temperature location to a lower temperature location. In the example illustrated in FIG. 8, computer circuit card 114a has a temperature of T1, support rail 120a of first side wall 102 has a temperature of T2 and the ambient environment has a temperature of T3. For heat H to flow from the computer circuit card 114a to the ambient environment, it is assumed that T1 is greater than T2, which is greater than T3.

Due to the differences in temperatures, heat H generated by the operation of computer circuit card 114a flows to the environment via support rail 120a and first side wall 102. The greater the differences between the temperatures T1, T2, and/or T3, the greater the flow of heat H is away from computer circuit card 114a. In other words, the larger the temperature difference, the larger the heat transfer rate. As long as the support rail 120a is at a lower temperature T2 than the computer circuit card 114a, heat transfer will continue.

The card cage system 100, in accordance with an example of the present disclosure, is configured to provide hybrid cooling of computer circuit cards 114a, 114b, 114c, and 114d. In addition to conductive cooling of computer circuit cards 114a, 114b, 114c, and 114d illustrated in FIG. 8, card cage system 100 provides convective cooling of computer circuit cards 114a, 114b, 114c, and 114d as well as convective cooling of side walls 102, 104 and support rails 120a, 120b, 120c, 120d, 122a, 122b, 122c, and 122d by the flow of cooling air through apertures 125a, 125b, 125c, 125d, 126a, 126b, 126c, 126d, 127a, 127b, 127c, 127d, 128a, 128b, 128c, and 128d.

Figure 9:
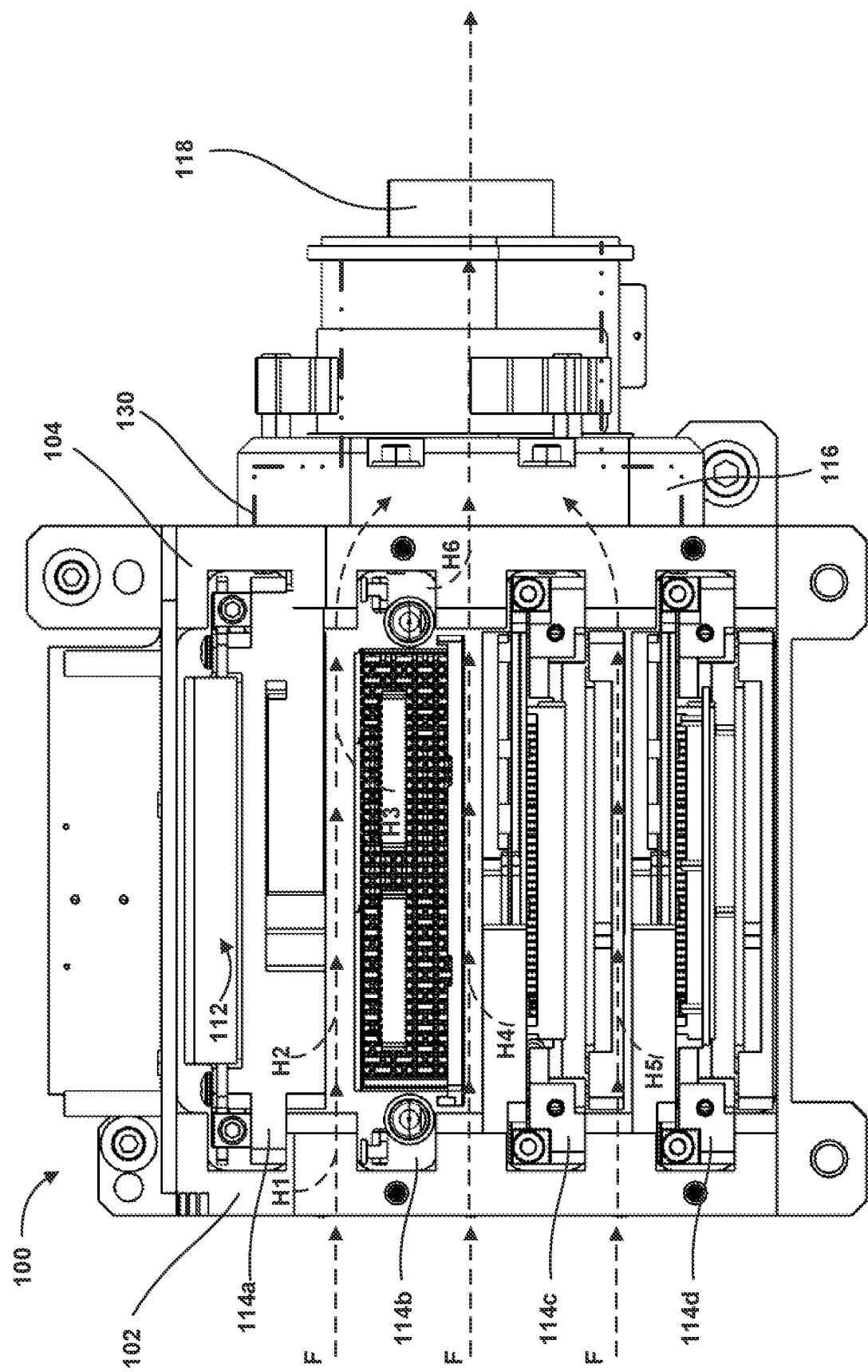
FIG. 9 illustrates a front view of the card cage system of FIG. 1 and shows airflow within the card cage system.

FIG. 9 illustrates the convective cooling of computer circuit cards, side walls, and support rails of card cage system 100. As shown in FIG. 9, computer circuit cards 114a, 114b, 114c, and 114d can be cooled by fluid flow F that enters card cage system 100 through the apertures formed in the one or more of the side walls and support rails. As the fluid flow F enters through the apertures of the first side wall 102 and support rails 120a, 120b, 120c, and 120d, the fluid flow F draws heat H1 from the first side wall 102 (including the support rails 120a, 120b, 120c, and 120d supported on the first side wall 102) to convectively cool the first side wall 102 and support rails 120a, 120b, 120c, and 120d. The fan 118 can, according to at least one example, drive fluid flow F to enter card cage system 100 through apertures in the first side wall 102 by actuation of the fan 118.

The apertures in the first side wall 102 are in fluid communication with the apertures in the second side wall 104 such that fluid flow F continues through card cage system 100 from the first side wall 102 to the second side wall 104 in the cavity 112 between the side walls. As the fluid flow F moves from the first side wall 102 to the second side wall 114, the fluid flow F draws heat H2, H3, H4, and H5 from each of the computer circuit cards 114a, 114b, 114c, and 114d to convectively cool the cards. The fluid flow F then exits through second side wall 104 through the apertures 127a, 127b, 127c, 127d, 128a, 128b, 128c, and 128d formed in the support rails 122a, 122b, 122c, and 122d and the second side wall 104 and draws heat H6 from the second side wall 104 and the support rails 122a, 122b, 122c, and 122d to convectively cool the second side wall 104 and the support rails 122a, 122b, 122c, and 122d. The fluid flow F then enters air chamber 130 (indicated as the dashed-dotted-dotted line) defined by cover 116 and is finally exhausted to the ambient environment by the fan 118.

The examples described herein yield multiple advantages and beneficial effects over the current state of the art. Examples of the present disclosure provide both convective and conductive cooling of computer circuit cards 114a, 114b, 114c, and 114d in a small constrained space without the need of additional large and bulky liquid cooling systems. Use of both conductive and convective cooling, cools the computer circuit cards 114a, 114b, 114c, and 114d more efficiently and more quickly then use of just one of conductive or convective cooling alone.

Additionally, the apertures formed in each of the support rails allows cooling fluid to flow through the support rails, thereby convectively cooling the support rails. Convectively cooling the support rails increases the support rails capacity to conduct heat away from the computer circuit cards. Larger temperature differences yield higher heat transfer rates. Conductive heat transfer rates increase as the temperature difference between two locations of different temperatures increases. Convective cooling of the support rails lowers the temperature of the support rails compared to the computer circuit cards, and therefore increases the heat transfer rate and the amount of heat drawn away from the computer circuit cards. Accordingly, providing convective cooling to the support rails improves the cooling of the computer circuit cards by: 1) conductively cooling the computer circuit cards through the support rails; 2) convectively cooling the computer circuit cards; and 3) improving the conductive cooling of the computer circuit cards by convectively cooling the support rails that facilitate the conductive cooling of the computer circuit cards. Thereby, the heat transfer and overall cooling of the computer circuit cards is improved by the examples described herein.

While the examples described herein have been mostly directed to the cooling of elements within a card cage system, the principles described herein may also be applied to a system for heating certain elements that need to be heated. Furthermore, examples described herein dispose the fan on a side wall adjacent to apertures of the card cage system. However, the fan (or multiple fans) may be disposed on any other walls of the card cage system as well such as the top, bottom, front, or back walls or others. The fan therefore is not limited to being disposed on a wall with apertures.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Although the disclosure may not expressly disclose that some embodiments or features described herein may be combined with other embodiments or features described herein, this disclosure should be read to describe any such combinations that would be practicable by one of ordinary skill in the art. The use of "or" in this disclosure should be understood to mean non-exclusive or, i.e., "and/or," unless otherwise indicated herein.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. A computer circuit card cage system configured to house one or more computer circuit cards, the computer circuit card cage system comprising:
   a housing comprising (i) multiple walls each having multiple first apertures formed therein and (ii) a computer circuit card storage cavity defined, at least in part, by the walls, wherein each of the first apertures extends through an entire thickness from an outer side to an inner side of the associated wall of the housing;
   multiple support rails supported on the walls and configured to support a computer circuit card on support surfaces of the support rails within the computer circuit card storage cavity, each of the support rails having multiple second apertures formed therein along a length of the support rail and configured to facilitate flow of a fluid through the support rail, the multiple second apertures of each support rail substantially aligned with the first apertures of the associated wall of the housing;
   wherein a flow path of the fluid is through the first apertures in the walls of the housing, through the second apertures in the support rails, and freely through the computer circuit card storage cavity of the housing between the support rails; and
   wherein a first support rail of the multiple support rails is supported on a first wall of the multiple walls of the housing and a second support rail corresponding to the first support rail is supported on a second wall of the multiple walls of the housing, the second wall being positioned opposite to the first wall, the first and second support rails configured to support the computer circuit card, the second apertures of each of the first and second support rails opening into the computer circuit card storage cavity; and
   a forced air system supported on the second wall and configured to force the flow of the fluid through the computer circuit card cage system between the first and second walls.

2. The computer circuit card cage system of claim 1, wherein the support rails are made of a thermally conductive material.

3. The computer circuit card cage system of claim 1, further comprising one or more fins supported by the first wall, at least some of the fins positioned between adjacent ones of the first apertures.

4. The computer circuit card cage system of claim 1, wherein the first wall and the second wall define, at least in part, the computer circuit card storage cavity between the first and second walls, the storage cavity being configured to store the one or more computer circuit cards.

5. The computer circuit card cage system of claim 1, wherein the support rails are supported at spaced apart locations within the computer circuit card cage system.

6. The computer circuit card cage system of claim 1, wherein the first and second apertures facilitate the flow of the fluid to or from an ambient environment.

7. The computer circuit card cage system of claim 1, wherein the forced air system is configured to surround and cover the first apertures along the outer side of the second wall.

8. The computer circuit card cage system of claim 1, wherein the forced air system comprises:
   a fan configured to move the fluid;
   a fan manifold comprising air channels operable to direct the fluid through the first apertures and the second apertures; and
   a cover operable to cover the air channels of the fan manifold.

9. The computer circuit card cage system of claim 1, wherein the first and second support rails are operable to support a common computer circuit card.

10. The computer circuit card cage system of claim 1, wherein the second apertures formed through the first support rail and the first apertures formed through first wall are in fluid communication with the second apertures formed through the second support rail and the first apertures formed through second wall to facilitate fluid flow through the computer circuit card storage cavity of the housing between the first wall and the second wall.

11. The computer circuit card cage system of claim 1, wherein the forced air system is configured to force the flow of the fluid through the computer circuit card storage cavity of the housing between the first wall and the second wall via blowing or suction.

12. A method for configuring a computer circuit card cage system configured to house one or more computer circuit cards, the method comprising:
- configuring the computer circuit card cage system to comprise a housing comprising (i) multiple walls each having multiple first apertures formed therein and (ii) a computer circuit card storage cavity defined, at least in part, by the walls, wherein each of the first apertures extends through an entire thickness from an outer side to an inner side of the associated wall of the housing;
- configuring the computer circuit card cage system to comprise multiple support rails supported on the walls and configured to support a computer circuit card on support surfaces of the support rails within the computer circuit card storage cavity, each of the support rails having multiple second apertures formed therein along a length of the support rail and configured to facilitate flow of a fluid through the support rail, the multiple second apertures of each support rail substantially aligned with the first apertures of the associated wall of the housing;
- wherein a flow path of the fluid is through the first apertures in the walls of the housing, through the second apertures in the support rails, and freely through the computer circuit card storage cavity of the housing between the support rails; and
- wherein a first support rail of the multiple support rails is supported on a first wall of the multiple walls of the housing and a second support rail corresponding to the first support rail is supported on a second wall of the multiple walls of the housing, the second wall being positioned opposite to the first wall, the first and second support rails configured to support the computer circuit card, the second apertures of each of the first and second support rails opening into the computer circuit card storage cavity; and configuring the computer circuit card cage system to comprise a forced air system supported on the second wall and configured to force the flow of the fluid through the computer circuit card cage system between the first and second walls.

13. The method of claim 12, wherein the support rails are supported at spaced apart locations within the computer circuit card cage system.

14. The method of claim 12, wherein the first and second apertures facilitate the flow of the fluid to or from an ambient environment.

15. The method of claim 12, wherein the forced air system is configured to surround and cover the first apertures along the outer side of the second wall.

16. The method of claim 12, further comprising:
configuring the forced air system to comprise:
- a fan configured to move the fluid;
- a fan manifold comprising air channels operable to direct the fluid through the first apertures and the second apertures; and
- a cover operable to cover the air channels of the fan manifold.

17. The method of claim 12, wherein the support rails are made of a thermally conductive material.

18. The method of claim 12, wherein the second apertures formed through the first support rail and the first apertures formed through first wall are in fluid communication with the second apertures formed through the second support rail and the first apertures formed through second wall to facilitate fluid flow through the computer circuit card storage cavity of the housing between the first wall and the second wall.

19. The method of claim 12, wherein the forced air system is configured to force the flow of the fluid through the computer circuit card storage cavity of the housing between the first wall and the second wall via blowing or suction.

20. The method of claim 12, further comprising:
configuring the computer circuit card cage system to comprise fins supported by the walls first wall, at least some of the fins positioned between adjacent ones of the first apertures.

* * * * *